United States Patent [19]
Wann et al.

[11] Patent Number: 5,514,610
[45] Date of Patent: May 7, 1996

[54] METHOD OF MAKING AN OPTIMIZED CODE ION IMPLANTATION PROCEDURE FOR READ ONLY MEMORY DEVICES

[75] Inventors: Yeh-Jye Wann, Hsin-Chu; Jue-Jye Chen, I-Lan, both of Taiwan

[73] Assignee: Taiwan Semiconductor Manufacturing Company, Hsinchu, Taiwan

[21] Appl. No.: 405,717

[22] Filed: Mar. 17, 1995

[51] Int. Cl.⁶ .................. H01L 21/265; H01L 21/70; H01L 27/00
[52] U.S. Cl. .................. 437/45; 437/52; 437/56
[58] Field of Search .................. 437/52, 48, 29, 437/45, 41 CS, 44; 148/DIG. 109; 257/390, 391, 392

[56] References Cited

U.S. PATENT DOCUMENTS

| | | | |
|---|---|---|---|
| 4,467,520 | 8/1984 | Shiotari | 257/391 |
| 4,992,389 | 2/1991 | Ogura et al. | 437/56 |
| 5,002,896 | 3/1991 | Naruke | 437/48 |
| 5,091,328 | 2/1992 | Miller | 437/52 |
| 5,202,272 | 4/1993 | Hsieh et al. | 437/29 |
| 5,264,386 | 11/1993 | Yang | 437/52 |
| 5,275,959 | 1/1994 | Kobayashi et al. | 437/52 |
| 5,278,078 | 1/1994 | Kanebako et al. | 437/29 |
| 5,308,777 | 5/1994 | Hong | 437/41 |

Primary Examiner—George Fourson
Assistant Examiner—Brian K. Dutton
Attorney, Agent, or Firm—George O. Saile

[57] ABSTRACT

A process designed to fabricate depletion mode MOSFET devices, for ROM applications, has been developed. A key feature of this fabrication sequence is the ion implantation step used to create the programmable cell. The code implant step is performed through a polysilicon gate structure, into the underlying channel region. The ability to reproducibly place the desired dopant at the desired channel location, is dependent on the implant conditions as well as the reproducibility of the thicknesses of the layers the implant has to penetrate. This process has been designed to remove some of the variables and thus result in optimized device characteristics.

18 Claims, 3 Drawing Sheets

METHOD OF MAKING AN OPTIMIZED CODE ION IMPLANTATION PROCEDURE FOR READ ONLY MEMORY DEVICES

BACKGROUND OF THE INVENTION (1) Field of the Invention

This invention relates to fabrication processes used to manufacture Read Only Memory devices, and more specifically to a method used to optimize the critical code ion implantation step.

(2) Description of Prior Art

Read Only Memory, (ROM), structures have been successfully employed as nonvolatile semiconductor memory devices. Most ROM designs and processes usually can be described by three elements. First, buried bit lines are placed in a silicon substrate. The bit lines usually are heavily doped regions, opposite in conductivity type then the substrate. Next word lines, usually polysilicon, are placed on gate oxide layers, perpendicular to the buried bit lines. Finally, a specific channel region, arising from the intersection of the bit and word lines, is selectively programmed to electrically respond differently then intersections that have not received the programmed treatment. The programmable cell, as it is normally referred to, can be created either prior to, or after the fabrication of the polysilicon word line. The programmable cell can be achieved via many techniques. For example, the programmable cell can be fabricated using a thicker or thinner gate oxide then the rest of the cells, and thus respond differently electrically. Another example of a programmable cell, described by Hong in U.S. Pat. No. 5,308,777 shows enhancement mode channel regions, that is p type channels, with n type source and drains. In this case the inventor alters the channel region by ion implanting concentrations of p type impurities, higher in doping level then doping levels found in the non-altered cells, thus resulting in the desired differences in electrical responses.

In this invention a process used to fabricate depletion mode ROM devices will be described. The programmable cell will be obtained by selectively ion implanting a specific cell, created by the intersection of n type bit lines, and polysilicon word lines. The ion implantation will also be n type, to achieve the depletion mode ROM device. However for this case the implantation will be performed through the already patterned polysilicon lines. This invention will also teach the semiconductor fabrication processes needed to achieve the optimum electrical response for the depletion mode ROM device.

SUMMARY OF THE INVENTION

It is an object of this invention to provide an improved method for fabricating Read Only Memory, (ROM), devices using a depletion mode, programmable cell.

It is another object of this invention to produce the programmable cell via ion implantation through a polysilicon word line.

It is yet another object of this invention to prepare the surface of the polysilicon, through which the code ion implantation step is to be performed, to a degree in which optimum depletion mode device characteristics will be achieved.

In accordance with the present invention a method is described for fabricating a depletion mode ROM device. A gate oxide is grown followed by polysilicon deposition and patterning, producing polysilicon gates. A spacer is created at the polysilicon sidewall by first depositing an insulator, followed by anisotropic etching procedures. A screen oxide is grown on the exposed silicon and polysilicon surfaces followed by the source and drain ion implantation steps. The programmable cell is then formed by initially removing the screen oxide, then photolithographically blocking all, but the programmable cell, followed by the code ion implantation procedure. Standard fabrication processing such as metal silicide formation, insulator deposition, contact hole patterning and metallization complete the fabrication stages of the ROM device.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method for obtaining the ROM device, using an optimized code ion implantation process, will now be described in detail.

Figure 1:
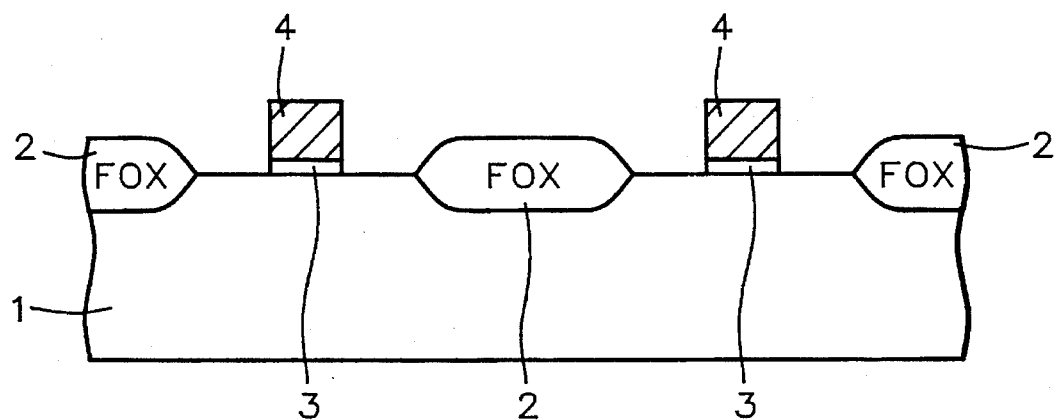
FIGS. 1–5, which schematically illustrate a series of cross-sectional representations that describe the process steps used to create the ROM device, featuring the optimized code implant process.

A substrate, 1, composed of p type, single crystal silicon with a <100> orientation, is used and shown in FIG. 1. Thick field oxide regions, 2, (FOX), are formed for isolation purposes. Briefly the method used to form the FOX regions is to use a thin thermal oxide, and a silicon nitride layer, as an oxidation mask. The desired FOX regions are etched open in the silicon nitride-silicon dioxide mask using conventional photolithographic, and reactive ion etching, (RIE), procedures. After removal of the masking photoresist, followed by a chemical clean, the field oxide is thermally grown, usually to a thickness between about 4000 to 6000 Angstroms. After removal of the masking layers, via hot phosphoric acid for the silicon nitride layer, and a buffered hydrofluoric solution for the silicon dioxide film, another wet chemical clean is performed followed by a carefully grown gate oxide layer, 3. The gate oxide is grown in an oxygen-steam ambient, at a temperature between about 850° to 950° C., to a thickness between about 140 to 250 Angstroms. Next a polysilicon film is deposited, using low temperature chemical vapor deposition, (LPCVD), via use of silane, at a temperature between about 600° to 700° C., to a thickness between about 2000 to 4000 Angstroms. An ion implantation procedure is then performed to the blanket layer of polysilicon, using phosphorous, at an energy between about 45 to 55 Kev., at a dose between about 2E13 to 2.5E13 atoms/cm2. An anneal cycle, at a temperature between about 900° to 920° C., is used to activate the dopants in the polysilicon layer. The ROM fabrication process continues by using conventional photolithographic and RIE procedures to create the polysilicon gate structures, 4, shown in FIG. 1. The RIE procedure can be accomplished using a etching environment containing SF6 and C12. At the conclusion of the RIE process the remaining gate oxide, 3, not covered by the polysilicon gate, is removed via a wet buffered hydrofluoric acid treatment.

Figure 2:
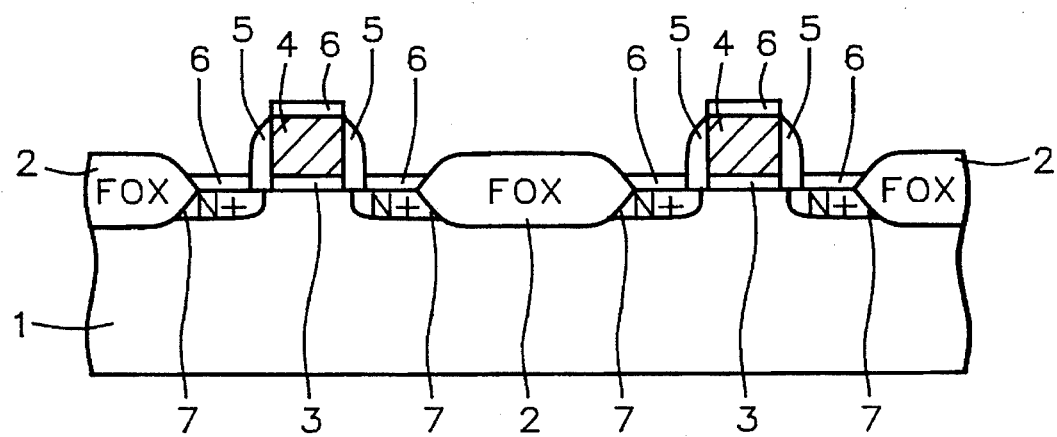

After photoresist removal, followed by wet chemical cleans, a layer of LPCVD silicon oxide is deposited at a temperature between about 650° to 750° C., to a thickness between about 2500 to 3500 Angstroms, using tetraethylorthosilicate, (TEOS). The TEOS layer is then subjected to an anisotropic RIE procedure using CF4 and CHF3, to create a TEOS sidewall insulator, 5, or spacer, shown in FIG. 2. Next a screen oxide, 6, is thermally grown on the exposed silicon and polysilicon surfaces. This is accomplished at a temperature between about 900° to 950° C., to a thickness between about 400 to 500 Angstoms, on the polysilicon surface, while the oxide on the single crystal silicon regions grow to a thickness between about 125 to 175 Angstroms. An ion implantation step is now carried out to produce the n type source and drain regions, 7, also shown in FIG. 2. The ion implantation is performed using arsenic, at an energy between about 65 to 75 Kev., at a dose between about 5E15 to 6E15 atoms/cm2.

Figure 3:
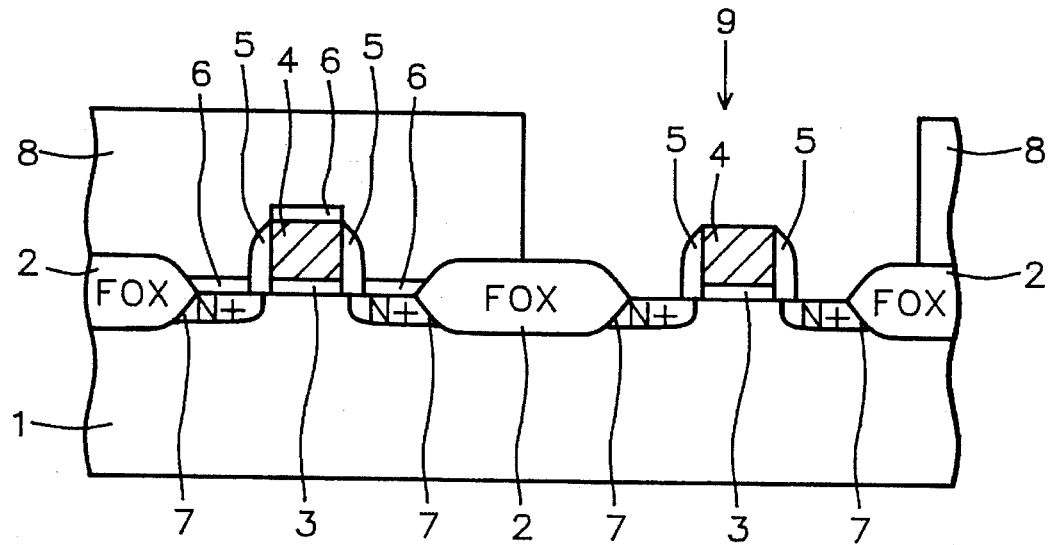
Figure 4:
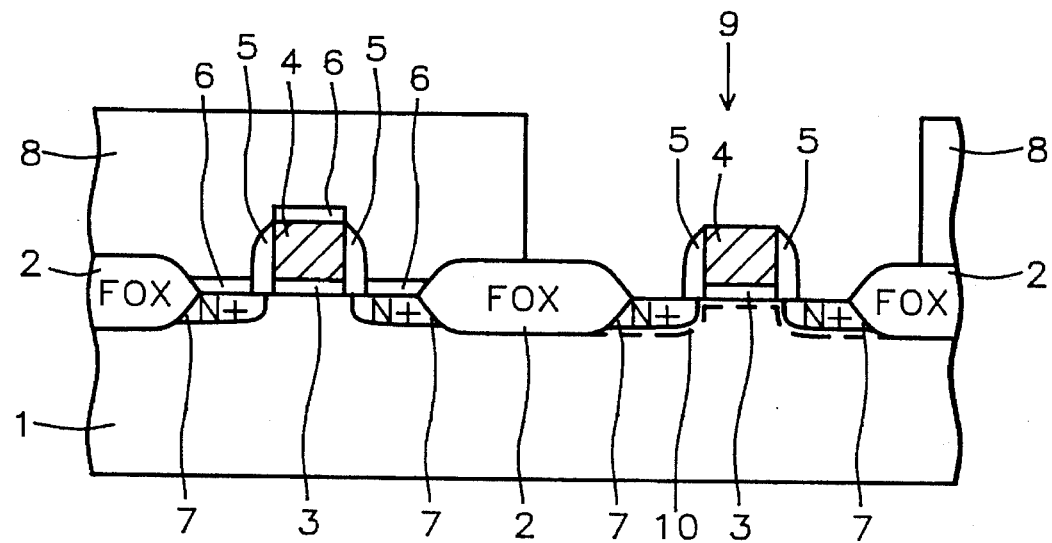

FIG. 3 shows the photoresist blockout, 8, applied to the entire ROM structure, except where the programmable cell, 9, is to be fabricated. A buffered hydrofluoric solution, at a 10:1 concentration, (10 parts NH4F to 1 part HF), is used for between about 5 to 15 sec. to remove screen oxide, 6, from the surface of polysilicon gate structure, 4, exposed in region 9. The screen oxide over the source and drain areas, 7, is also removed in this procedure. This is illustrated in FIG. 4. Next the critical code ion implantation step is performed to region 9, using phosphorous at an energy between about 160 to 180 Kev., at a dose between about 5E13 to 8E13 atoms/cm2. The result of the ion implantation step is illustrated in FIG. 4, and the dopant implanted through the polysilicon structure, 4, is shown as region 10. It is important to note that the creation of the depletion mode device, in region 9, is dependent on the amount of phosphorous reaching the channel region, through the polysilicon gate. The ability to accurately and consistently place phosphorous at the desired channel location, is dependent on having consistent thicknesses of polysilicon and screen oxide, to implant through. Thus the elimination of one of the films, the screen oxide, via buffered hydrofluoric removal, results in decreased process sensitivity. For example the critical drain current parameter was increased, and the standard deviation was reduced, via use of this optimized process. In addition, prior to the creation of this optimized implant process, higher doses of phosphorous had to be used to insure the proper level of dopant reaching the channel region, and not being screened by the variable thickness of the masking oxide. Since this variability has been removed lower doses of phosphorous can be used, thus greatly reducing implant currents and implant time, resulting in increased tool utilization.

Figure 5:
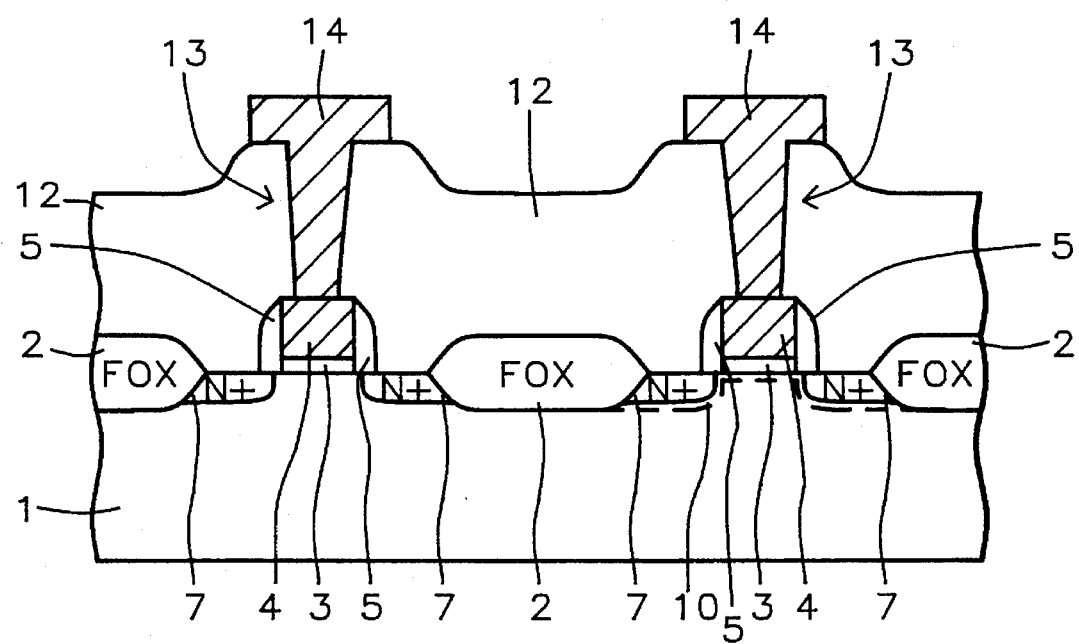

FIG. 5 shows the continuation of the fabrication process, created to improve ROM parametrics and yield. The masking photoresist, 8, is removed, followed by careful wet cleans. Next an oxide layer, 12, using borophososilicate, (BPSG), is deposited to a thickness between about 5000 to 10000 Angstroms, followed by standard photolithographic and RIE procedures, used to create via holes, 13, to the polysilicon gate structures, 4, and to the source and drain regions, 7, (not shown). Metallization and patterning are used to form the metal contacts, 14.

This process for an optimized code ion implantation, for ROM devices, although shown as part of a depletion mode device, can also be applied to enhancement type ROM devices. In addition the process described can be used for the fabrication for any metal oxide semiconductor field effect transistor, (MOSFET), including complimentary, (CMOS), as well as bipolar-CMOS, (BiCMOS).

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a Read Only Memory, (ROM), cell on a semiconductor substrate comprising the steps of:

forming a field oxide pattern on specific regions of said substrate while leaving bare silicon on remaining regions of said substrate;

growing a gate oxide on said bare silicon;

depositing a polysilicon layer on said gate oxide, and on said field oxide pattern;

ion implanting a first conductivity imparting dopant into said polysilicon layer;

patterning to form polysilicon gate structure, from said polysilicon layer, on said gate oxide and on said field oxide pattern;

removal of said gate oxide from regions not covered by said polysilicon gate structure, to expose regions of said bare silicon;

depositing a first insulator layer on said polysilicon gate structure, on said field oxide pattern, not covered by said polysilicon gate structure, and on said bare silicon;

anisotropically etching of said first insulator layer to form a spacer insulator on sidewall of said polysilicon gate structure;

growing a screen oxide on said polysilicon gate structure, and on said bare silicon;

ion implanting a second conductivity imparting dopant into said polysilicon gate structure, and into said bare silicon, through said screen oxide;

photolithography to expose specific region of the silicon chip, consisting of said polysilicon gate structures, and regions of said bare silicon;

removal of said screen oxide from said polysilicon gate structure, and from said bare silicon, in said specific region of the silicon chip, exposed by photolithography; and ion implanting a third conductivity imparting dopant through said polysilicon gate structure, and through said gate oxide.

2. The method of claim 1, wherein said gate oxide is grown at a temperature between about 850° to 950° C., to a thickness between about 140 to 250 Angstroms.

3. The method of claim 1, wherein said polysilicon layer is deposited at a temperature between about 600° to 700° C. to a thickness between about 2000 to 4000 Angstroms.

4. The method of claim 1, wherein said first conductivity imparting dopant is phosphorous, ion implanted at an energy between about 45 to 55 Kev., at a dose between about 2E13 to 2.5E13 atoms/cm2.

5. The method of claim 1, wherein said first insulator, layer used to form said spacer insulator, is $SiO_2$, deposited from a TEOS source, using LPCVD, to a thickness between about 2500 to 3500 Angstroms.

6. The method of claim 1, wherein said screen oxide, on top surface of said polysilicon gate structure, is grown at a temperature between about 900° to 950° C., to a thickness between about 400 to 500 Angstroms.

7. The method of claim 1, wherein said second conductivity imparting dopant is arsenic, ion implanted at an energy between about 65 to 75 Kev., at a dose between about 5E15 to 65E15 atoms/cm2.

8. The method of claim 1, wherein said screen oxide, on top surface of said polysilicon gate structure, in said specific region of the silicon chip, is removed with a buffered hydrofluoric acid solution, for a time between about 5 to 15 sec., at a temperature between about 20° to 25° C.

9. The method of claim 1, wherein said third conductivity imparting dopant is arsenic, ion implanted at an energy between about 160 to 180 Kev., at a dose between about 5E13 to 8E13 atoms/cm2.

10. A method of fabricating a Read Only Memory, (ROM), cell, on a semiconductor substrate comprising the steps of:

forming a field oxide pattern on specific regions of said substrate, while leaving bare silicon on remaining regions of said substrate;

growing a gate oxide on said bare silicon;

depositing a polysilicon layer on said gate oxide, and on said field oxide pattern;

ion implanting a first conductivity imparting dopant into said polysilicon layer;

patterning to form polysilicon gate structure, from said polysilicon layer, on said gate oxide and on said field oxide pattern;

removal of said gate oxide from regions not covered by said polysilicon gate structure, to expose regions of said bare silicon;

depositing a first insulator layer on said polysilicon gate structure, on said field oxide pattern, not covered by said polysilicon gate structure, and on said bare silicon;

anisotropically etching of said first insulator layer to form a spacer insulator on sidewall of said polysilicon gate structure;

growing a screen oxide on said polysilicon gate structure, and on said bare silicon;

ion implanting a second conductivity imparting dopant, through said screen oxide, into said polysilicon gate structure, and into said bare silicon to form source and drain areas;

photolithography to expose specific region of the silicon chip, to be used for the programmable cell, consisting of specific said polysilicon gate structures, and specific said source and drain regions;

removal of said screen oxide from said polysilicon gate structure, and from said source and drain areas, in said specific regions of silicon chip to be used for programmable cell; and ion implanting a third conductivity imparting dopant, rough said polysilicon gate structure, through said gate oxide, to form depletion mode, programmable cell.

11. The method of claim 10, wherein said gate oxide is grown at a temperature between about 850° to 950° C., to a thickness between about 140 to 250 Angstroms.

12. The method of claim 10, wherein said polysilicon layer is deposited at a temperature between about 600° to 700° C., to a thickness between about 2000 to 4000 Angstroms.

13. The method of claim 10, wherein said first conductivity imparting dopant is phosphorous, ion implanted at an energy between about 45 to 55 Kev., at a dose between about 2E13 to 2.5E13 atoms/cm2.

14. The method of claim 10, wherein said first insulator layer, used to from said spacer insulator, is $SiO_2$, deposited from a TEOS source, using LPCVD, to a thickness between about 2500 to 3500 Angstroms.

15. The method of claim 10, wherein said screen oxide, is grown at a temperature between about 900° to 950° C., to a thickness between about 125 to 175 Angstroms on said bare silicon regions, and grown to a thickness between about 400 to 500 Angstroms on the top surface of said polysilicon gate structure.

16. The method of claim 10, wherein said second conductivity imparting dopant, used to create said source and drain regions, is arsenic, ion implanted at an energy between about 65 to 75 Kev., at a dose between about 5E15 to 6E15 atoms/cm2.

17. The method of claim 10, wherein said screen oxide, on top surface of said polysilicon gate structure, in said specific region used for programmable cell, is removed in a buffered hydrofluoric acid solution, for a time between about 5 to 15 sec., at a temperature between about 20° to 25° C.

18. The method of claim 10, wherein said third conductivity imparting dopant, used to create depletion mode channel region in said specific region used for programmable cell, is phosphorous, ion implanted at an energy between about 160 to 180 Kev., at a dose between about 5E13 to 8E13 atoms/cm2.

* * * * *